United States Patent [19]
Hatanaka et al.

[11] Patent Number: 5,910,390
[45] Date of Patent: Jun. 8, 1999

[54] METHOD FOR FORMING PATTERN

[75] Inventors: Hideyuki Hatanaka, Chiba; Keita Miyasato, Fukushima, both of Japan

[73] Assignee: Nitto Boseki Co., Ltd., Fukushima, Japan

[21] Appl. No.: 08/813,945

[22] Filed: Mar. 3, 1997

[30] Foreign Application Priority Data

Mar. 5, 1996 [JP] Japan ................................. 8-047252

[51] Int. Cl.$^6$ ....................................... G03F 7/00
[52] U.S. Cl. ........................ 430/139; 430/290; 430/311
[58] Field of Search ................................. 430/290, 313, 430/139, 395, 502, 311, 322, 325; 250/492.1, 492.2; 283/87, 92

[56] References Cited

U.S. PATENT DOCUMENTS

| | | | |
|---|---|---|---|
| 2,441,010 | 5/1948 | Dobbins | 430/395 |
| 4,379,833 | 4/1983 | Canavello et al. | 430/395 |
| 4,735,877 | 4/1988 | Kato et al. | 430/5 |
| 5,532,104 | 7/1996 | Goto | 430/139 |

FOREIGN PATENT DOCUMENTS

| | | |
|---|---|---|
| 359051528 | 3/1984 | Japan. |
| 362081633 | 4/1987 | Japan. |
| 401102459 | 4/1989 | Japan. |
| 404051152 | 2/1992 | Japan. |

*Primary Examiner*—Kathleen Duda
*Attorney, Agent, or Firm*—Armstrong, Westerman, Hattori, McLeland and Naughton

[57] ABSTRACT

A method for forming a resin pattern which includes selectively polymerizing a photopolymerizable resin utilizing a light radiated from a photosensitive substance to form a desired resin pattern. A photosensitive substance layer is formed in a desired pattern on a substrate (or in a substrate when it is light permeable). The photosensitive substance absorbs an irradiation light and radiates a light of a longer wavelength than that of the irradiation light. A photopolymerizable resin layer formed on the substrate is not activated by the irradiation light but is activated by the light radiated from the photosensitive substance. The photopolymerizable resin layer is irradiated with an irradiation light capable of exciting the photosensitive substance and the photopolymerizable resin is polymerized in the pattern of the photosensitive substance layer with the light radiated from the photosensitive substance.

19 Claims, 4 Drawing Sheets

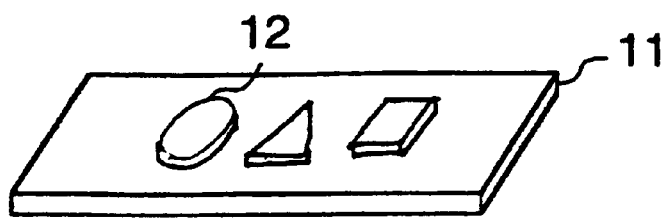
FIG. 5 (a)
FIG. 5 (b)
FIG. 6
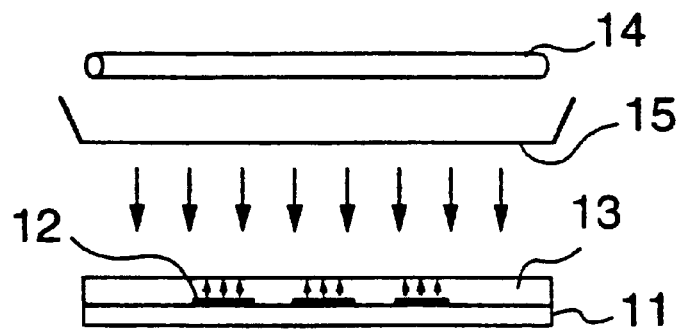
FIG. 7
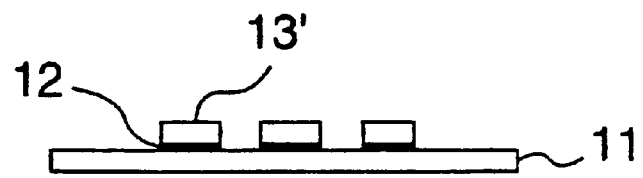

METHOD FOR FORMING PATTERN

BACKGROUND OF THE INVENTION

This invention relates to a method for forming a desired resin pattern which comprises selectively polymerizing a photopolymerizable resin in the necessary portion of a layer composed of the photopolymerizable resin, a radical generator and a sensitizing agent by utilizing a light radiated from a photosensitive substance to form a desired resin pattern on said layer. The method of this invention is particularly effective in fields requiring a high resolution including a field of the production of a printed wiring board (PWB) of a narrow pad pitch used in surface mount or a printed wiring board having circuits of a narrow pattern pitch, and the like.

It has heretofore been difficult that in a substrate having a narrow pitch conductor layers or the like, the space between the conductor layers is exactly filled with an insulating substance for protecting a circuit such as a solder resist.

For example, in the field of a printed wiring board, the surface mounting of devices is allowed to proceed by the high densification or high integration of LSI and IC. In the case of the surface mount, unlike a conventional through-hole mount in which a plating is applied to the inner wall of a throughhole, pads which are bonding portions of lead pins of an LSI package are formed on the surface of a wiring board, a solder layer is provided on each of the pads and the lead pins are bonded to the pads using this solder layer as an adhesive.

Until before several years, there had been mainly used the QFP (Quad Flat Package) type packages in which the number of pins is about 100 to 200. In this case, the lead pin pitch is about 0.65 to 0.5 mm and it is possible to form solder layers by a conventional screen printing method, by a solder coat method or the like. In the case of the screen printing method, a creamy solder is directly coated on a pad for connecting the pad with a pin. In addition, in the case of the solder coat method, a PWB is immersed in a molten solder and thereafter pulled up and a high-temperature air is blown thereagainst to blow off the solder, thereby forming a solder layer on the pad.

When the pad pitch is not less than 0.5 mm as mentioned above, the pad portion on which the package can be mounted can be obtained.

However, high densification and high integration of LSI have proceeded more and more and there has now appeared such a package as TCP for loading TAB having about 500 to 600 pins.

In packages having as many pins as mentioned above, the pin pitch becomes 0.2 to 0.3 mm, and when a screen printing method is used a position deviation is necessarily caused, and when a solder coat method is used the solder between pads is not completely removed. Both of them cause a short circuit.

No technique for printed wiring boards capable of responding to the mounting of a package having as narrow a pin pitch as about 0.2 to 0.3 mm has been settled by now.

Among various techniques, a super solder method and an electroless solder plating method have been tried as methods for forming a solder layer on a pad.

In the super solder method, creamy solder is coated on the whole of a pad area and the solder is heated by a reflow soldering, upon which the melted solder gathers on the copper portion of the pad by surface tension to form a solder layer. However, this has such a problem that unless the heating is uniformly effected, a variation is caused in the thickness of the solder layer between pads.

In the case of the electroless solder plating method, a solder plate layer is formed in such a matter as to be permuted for a part of the copper layer, so that this is disadvantageous in that the thickness of the copper layer in the pad portion becomes thinner than the necessary thickness. For preventing this, it has been considered that the thickness of the first copper panel plate is designed larger than the necessary thickness. However, making the thickness of the copper plate larger than the necessary thickness is not suitable for the formation of a fine pattern.

However, even the above-mentioned super solder method and screen printing method are considered to become applicable to such a narrow pitch article (for example, wiring board) if the narrow space between pads can be filled with an insulating layer.

That is to say, in the case of the super solder method, creamy solder is applied to the whole of the irregular surface of the pad area and heated and melted, upon which a solder layer is formed on the pad portion owing to the surface tension of the molten solder and the affinity of the molten solder to copper in the pad portion. When a super solder method is applied to a wiring board in which the space between pads is filled with an insulator so that the pad portion and the insulator layer form substantially a plane, it is considered that the variation of thickness of the coated creamy solder layer in each position becomes small and the variation of thickness of solder layer formed on each pad due to uneven heating becomes small.

In the case of the screen printing method, when the pad pitch becomes narrow, the printing position of the creamy solder tends to be deviated and in this case, the creamy solder in the deviated portion falls down in the space between pads and tends to form a bridge between the pad and the adjacent pad when heated and melted. However, when the screen printing method is applied to a wiring board in which the space between pads is filled with an insulator to make the circumference of the pad portion close to a plane, it is considered that even if a creamy solder should be printed in a deviated position it would remain in that position without falling down to a lower position between the pads when it is heated and melted or it would shift in the direction to the copper layer of the pad owing to the surface tension of the molten solder and the affinity of the solder to copper.

The filling of the space between pads with an insulator is considered to be made possible by coating a photosensitive resin on the pads, exposing only the space portions between the pads through a photomask to a light to polymerize only the exposed resin and removing the unpolymerized resin by development. However, when the pad pitch is 0.2 mm and the width of the pad is 0.1 mm, the space between the pads also becomes 0.1 mm, and hence, such a disadvantage is caused that when the position of the photomask is deviated the photosensitive resin layer overlays the pad as much as the position deviation. Accordingly, the precision of the alignment of a photomask becomes required to be ±0, and it is very difficult to completely fill only the space between pads with an insulator layer.

When the substrate size is 500×500 mm and QFP pads (0.5-mm pitch) are present at both ends, even if one of the QFP pads and a negative film are aligned without a bit difference and are placed in the ideal state, the shrinkage of the substrate by 0.02% makes the substrate size shorter than the negative film and causes a deviation of 100 $\mu$m of the film at the other end QFP pad. As a result, the solder resist comes to run on the pad and consequently a failure due to fog is caused. Therefore, a substrate maker has been strongly asked to provide a substrate having a good dimensional stability (a substrate whose elongation and shrinkage are small or a substrate whose variation in elongation and shrinkage is small). Experientially, it is general that the dimension of a substrate material is varied by about 0.02 to 0.04% in the course of production of a PWB, and a corrective film is planned supposing this variation in the preparation of the above-mentioned negative film. However, the variation in dimensional change is great every sheet of substrate or every number of article different in the remaining area of pattern copper and usually, the dimensional change is varied exactly by +0.01–0.03%. Therefore, ideally, a method of forming a resist pattern without using a negative film is desired.

SUMMARY OF THE INVENTION

An object of this invention is to provide a pattern, particularly a high resolution pattern, of a photopolymerizable resin without using a negative film.

Another object of this invention is to provide a method by which the space between conductors or the like arranged on a substrate at such a narrow distance that the pin pitch is below 0.3 mm can be exactly filled with a resin layer (an insulator layer).

A still another object of this invention is to provide a process for producing a printed wiring board for mounting in which the space between pads arranged at a narrow distance is filled with an insulator layer.

Other objects and advantages of this invention will become apparent from the following description.

According to this invention, there is provided a method for forming a pattern which comprises:

(a) providing a light-permeable substrate containing a photosensitive substance which absorbs an irradiation light and radiates a light having a longer wavelength than the wavelength of the irradiation light on or in which substrate a photosensitive substance layer is formed in the desired pattern shape or a light-impermeable layer is formed in the inverted pattern shape of the said pattern shape, (b) forming a photopolymerizable resin layer on the said substrate by coating on the substrate a photopolymerizable resin which contains a radical generator and a sensitizer and which is not activated by the irradiation light but is activated by the light radiated from the photosensitive substance which has absorbed the irradiation light or by putting on the above substrate a sheet of the said photopolymerizable resin containing a radical generator and a sensitizer, (c) irradiating the above photopolymerizable resin layer with an irradiation light capable of exciting the photosensitive substance and polymerizing the photopolymerizable resin in a portion corresponding to the pattern of the photosensitive substance layer with said light having a longer wavelength radiated by the photosensitive substance which has absorbed the irradiation light, and thereafter, (d) removing the unpolymerized resin in the portion which has not been irradiated with the radiation light.

In this invention, a reflected light from the photosensitive substance which has absorbed ultraviolet rays is utilized to selectively photo-cure the photopolymerizable resin layer only in the specific places. According to this invention, a photopolymerizable resin layer is irradiated with ultraviolet rays from above without using a negative film, and with the a reflected light from a photosensitive substance contained in the ultraviolet ray-irradiated portion of a layer containing the photosensitive substance, this layer being formed on or in a substrate placed under the said ultraviolet ray-irradiated photopolymerizable resin layer, can be selectively polymerized and cured only a photopolymerizable resin layer corresponding to the said ultraviolet ray-irradiated portion. Therefore, according to this invention, the space between the pads or the like provided at a narrow distance on the substrate can be exactly filled with a cured resin (resist).

BRIEF DESCRIPTION OF THE DRAWINGS

FIG. 5 (a) is a perspective of a substrate on which a photosensitive substance layer is printed in patterns of ○, Δ and □ and FIG. 5 (b) is a cross-sectional view of the substrate.

FIG. 6 shows a state in which the substrate of FIG. 5 (a) on which a resist ink (a photopolymerizable resin) layer has been formed is irradiated with an irradiation light and the resist ink is photopolymerized with a reflected light resulting form the irradiation.

FIG. 7 is a cross-sectional view of the substrate after the unpolymerized portions of the resist ink has been removed.

In FIGS. 1 to 10, 1 refers to a pad, 2 to a substrate, 3 to a resist ink, 4 to a high pressure mercury vapor lamp, 5 to an optical filter, 6 to an irradiation light, 7 to a reflected (radiation) light, 8 to a resist, 11 to a laminate substrate, 12 to a pattern layer containing a fluorescent whitening agent, 13 and 13' to photopolymerizable resin layers, 14 to an ultraviolet-ray source, 15 to a filter, 21 to a substrate having a curved surface, 22 to a letter pattern layer containing a fluorescent whitening agent, 23 to a convex letter pattern consisting of a photopolymerizable resin, 34 to an injection molded article having a curved surface, 35 to a letter pattern layer containing a fluorescent whitening agent, 36 to a polyimide film, 37 to a mold and 38 to a resin-injection gate.

DETAILED DESCRIPTION OF THE INVENTION

Figure 1:
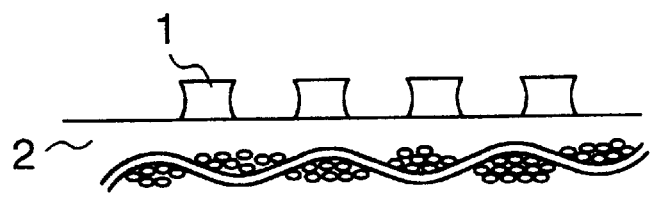
FIG. 1 is a cross-sectional view of a photosensitive substance-containing substrate having pads at a narrow distance before being coated with a resist ink (a photopolymerizable resin).
Figure 8:
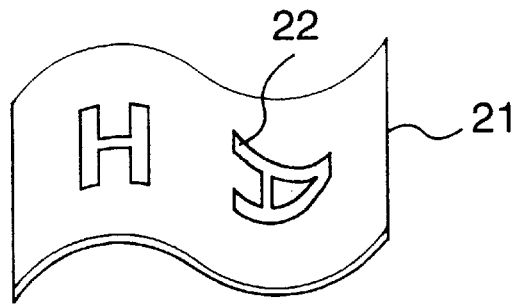
FIG. 8 is a perspective of a substrate having a curved surface on which letters of a photosensitive substance layer are formed.
Figure 10:
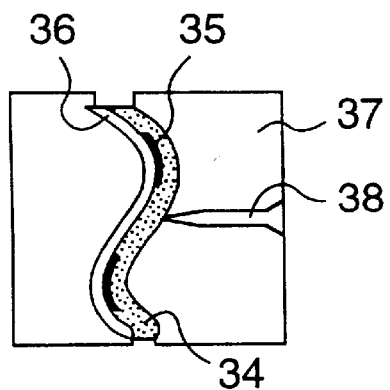
FIG. 10 is an explanatory view (sectional view) of the formation of a curved surface of a substrate in which the formation of a curved surface and the printing of a photosensitive substance layer are simultaneously carried out.
Figure 11:
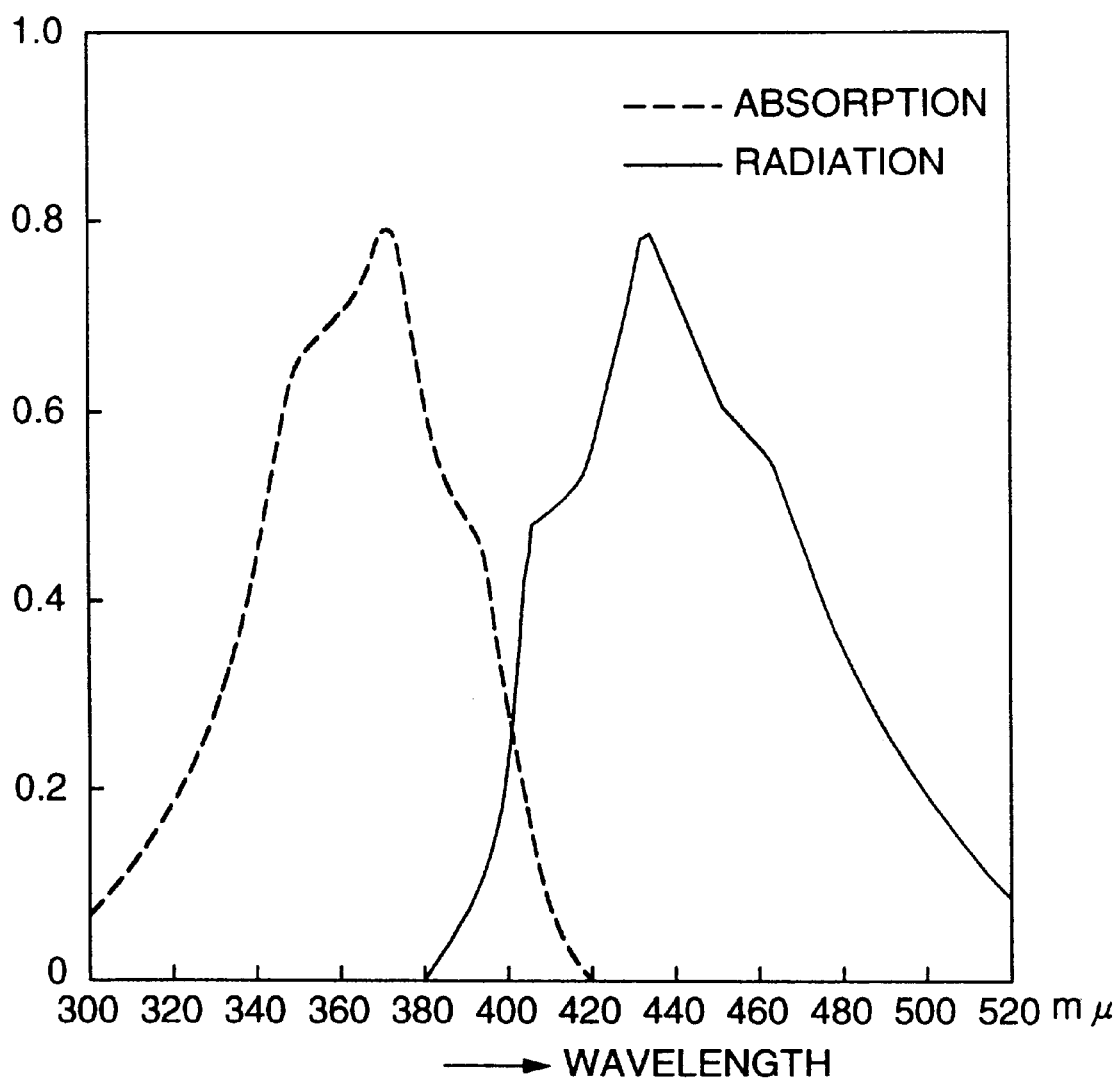
FIG. 11 is a graph of absorption and radiation curves of the photosensitive substance used in Example 1.

In this invention, as the substrate, there are mentioned, for example, a plate, a sheet, a film and the like, and as the film, there are mentioned films of polyamide, polyester, polyimide, polyolefin and the like. However, as the substrate used in the practice of this invention, there can be used not only a flat-shaped one and a light-penetrable one but also a three-dimensional molded article having a curved surface or an irregular surface and a light-impermeable substrate. In this invention, the photosensitive substance-containing substrate on or in which a photosensitive substance layer has been formed in the desired pattern shape or a light-impermeable layer has been formed in the inverted pattern of said desired pattern includes substrates having various modes, for example, a photosensitive substance-containing substrate having on its surface a light-impermeable layer (for example, pad) of a narrow pitch as shown in FIG. 1; a substrate having formed thereon a photosensitive substance layer in the desired pattern by printing or the like; a substrate in which a photosensitive substance is embedded in the desired portion on one side; a curved plate having drawn thereon a letter or pattern of a photosensitive substance-containing layer as shown in FIG. 8; a substrate having a curved surface as shown in FIG. 10 on which a photosensitive substance-containing layer has been formed in the desired pattern simultaneously with forming the said substrate; a substrate whose internal layer contains a photosensitive substance-containing layer; a substrate which itself is light-permeable and has formed thereon a pattern of a photosensitive substance-containing layer as shown in FIG. 8 or 10; and the like.

The photosensitive substance has such an actions as to absorb the light energy of a light beam, converts the absorbed energy to a light having a long wavelength and radiates the same. Such a photosensitive substance includes, for example, fluorescent whitening agent.

The fluorescent whitening agent is generally a reagent emphasizing a white color used in fabrics, paints, printing inks and the like, and has, for example, such an action as to absorb a light energy having a wavelength of about 300 to 400 nm corresponding to the ultraviolet region of a light beam, convert the absorbed energy to a violet to blue visible light of a wavelength of about 400 to 500 nm and radiate (reflect) the visible light. As the fluorescent whitening agent, various types are commercially available and the wavelengths of the absorbed light and the radiated light are varied depending upon the type. This invention is directed to a method in which said reflected lights are utilized and the photopolymerizable resin is cured in the specific places (which permeate the reflected light) with the reflected light, and which method can be suitably carried out by an adequate selection of a combination of the photosensitive substance with the photopolymerizable resin to be polymerized with the reflected light.

The fluorescent whitening agent which is an example of the photosensitive substance includes, for example, bis (triazinylamino)stilbene disulfonic acid derivatives, coumarin derivatives, pyrazoline derivatives, naphthalimide derivatives, bisbenzoxazolyl derivatives, bisstyrylbiphenyl derivatives and the like.

These derivatives have an absorption peak (the most sensitive wavelength) in the ultraviolet region of about 330–380 nm and a radiation light peak in a wavelength region of about 400–450 nm.

These fluorescent whitening agents can be used alone or in admixture of two or more kinds.

Specifically, for example, 2,5-bis(5'-tert-butylbenzoxazolyl(2))thiophene which is one of the bisbenzoxazolyl derivatives has the most sensitive wavelength at a wavelength of 375 nm and a radiation light peak at a wavelength of 435 nm.

The amount of the fluorescent whitening agent used is preferably in the range of from 0.1 to 5% by weight based on the weight of the substrate. When the amount is less than 0.1% by weight, the effect of this invention is not sufficiently exerted and when the amount is more than 5% by weight, the mechanical characteristics of the substrate and the curing characteristics of the resin are adversely affected.

The light-permeable substrate used in this invention is a material which a light permeates and includes, for example, an epoxy resin laminate reinforced with a glass fiber or the like, a polyester resin laminate, a bismaleimidotriazine resin laminate, a polyimide resin laminate, a fluoroplastic laminate, a polyphenylene oxide resin laminate, a polycarbonate resin laminate, a polyether imide resin laminate, a Teflon resin laminate and the like. However, the reinforcement with a glass fiber or the like is not essential, and there can be also used those resin laminates which are not reinforced with a glass fiber or the like.

Among them, a glass-epoxy laminate and the like are preferably used. As a method of incorporating a photosensitive substance into a glass-epoxy laminate, there may be used a method in which a fluorescent whitening agent is attached to a glass fiber substrate used as a reinforcing material, a method in which a photosensitive substance is blended with an epoxy varnish, or a combination of the two methods.

The thickness of the substrate may be about 0.05 to 10 mm. In the case of a thicker substrate, the photosensitive substance can be allowed to be present in the surface layer portion of the substrate.

The substrate of this invention can be used in various fields, for example, a printed wiring board, a hybrid IC substrate, a light emitting diode substrate and the like.

In this invention, the material capable of forming a light-impermeable layer of a narrow pitch on the photosensitive substance-containing substrate includes, for example, metals such as copper, nickel, gold, silver, chromium, zinc, solder alloy and the like; metal salts such as silver chloride and the like; and ceramics such as alumina, aluminum nitride, silicon nitride and the like. In this case, a method of forming a light-impermeable layer on the substrate is not critical; however, such a method as a method of forming a circuit for a printed wiring board can be used, and in this case, a conductive circuit becomes a light-impermeable layer. In the conductive circuit, in some cases, pads for mounting a LSI package are continuously provided. The formation of pads is conducted simultaneously with forming the circuit portion. In the case of the said pads, in some cases, the pitch becomes a narrow pitch of about 0.2 to 0.3 mm owing to the high densification and high integration of LSI.

In this invention, a photopolymerizable resin containing a radical generator and a photosensitizer which responds to the reflected light from the photosensitive substance layer formed in the desired pattern on the photosensitive substance-containing substrate is coated on the substrate or a sheet of the said photopolymerizable resin is put on the substrate to form a photopolymerizable resin layer. In this case, when the substrate has irregularities, the photopolymerizable resin is coated thereon to form a photopolymerizable resin layer.

When the photosensitive substance is a fluorescent whitening agent, the wavelength of ultraviolet ray which is the irradiation light is usually selected from the range of from 300 nm to 380 nm. The light radiated from the fluorescent whitening agent is a visible light (for example, a violet to blue visible light).

The photopolymerizable resin used in this invention contains a sensitizer and a photopolymerization initiator which is not activated by the irradiation light but is activated by a light radiated from the photosensitive substance which has absorbed the irradiation light to generate a free radical. In this case, the term "is not activated by the irradiation light" used above includes a case where the initiator is not activated by the light and a case where the initiator is activated by the light but is dissolved when subjected to development. The photopolymerizable resin contains an ethylenically unsaturated bond, and is activated by the radiated light to become insoluble in a 1% by weight aqueous sodium carbonate solution. For example, as an acrylic acid ester type, there are used monomers such as methyl methacrylate, tert-butyl methacrylate, tert-butyl acrylate, ethylene glycol diacrylate, ethylene glycol dimethacrylate, hexamethylene glycol diacrylate, hexamethylene glycol dimethacrylate, and the like and oligomers thereof, and in addition, acrylated alkyd resins, polyether acrylate resin, acrylated epoxy resins, acrylated polyurethane resins, acrylated polyurethane resins, acrylated spiran resins, polyspiran resins and the like.

In this invention, a photopolymerizable resin containing a radical generator and a sensitizer is used. In the photopolymerizable resin of this invention, there is co-used a compound which can absorb at a high sensitivity a light in a wavelength region of 400–580 nm corresponding to the light radiated from the photosensitive substance and generate a radical. The said compound includes a specific combination of a radical generator with a sensitizer.

Many materials which are generally called "radical generators" are activated by a light at 300 to 400 nm which is the ultraviolet wavelength region. However, recently, it has been reported that by combining with a compound having a specific sensitizing action, the most sensitive wavelength can be shifted to a wavelength region of at least 400 nm.

The photopolymerization initiator used in this invention may be an initiator whose most sensitive wavelength is in the wavelength region of from 400 to 580 nm and which has such properties as to satisfy the relation of X>Y in which X [$mJ/cm^2$] is the minimum sensitivity at an irradiation wavelength region of from 300 to 400 nm and Y [$mJ/cm^2$] is the minimum sensitivity at 400–580 nm, preferably has such properties as to satisfy the relation of X>2Y. The term "minimum sensitivity" used above means the minimum energy [$mJ/cm^2$] that when a given area is irradiated with a given dose of light and thereafter immersed in or sprayed with a developer consisting of 1% by weight aqueous sodium carbonate solution, the area is insolubilized in the developer. The specific numerical value of the minimum energy is preferably such that Y is in the range of from 0.1 to 10 $mJ/cm^2$.

The radical generator satisfying the above-mentioned conditions includes, for example, imidazole dimers such as hexaaryl biimidazole; compounds such as N-phenylglycine, 2,4,6-tris(trichloromethyl)-s-triazine (abbreviated as TCT), 3-phenyl-5-isooxazolone, 2-mercaptobenzimidazole, 1,3-di(tert-butyldioxycarbonyl)benzene, 3,3',4,4'-tetrakis(tert-butyldioxycarbonyl)benzophenone (abbreviated as TBBP) and the like; anionic compounds such as triphenylbutyl borate ion, trianisylbutyl borate ion and the like; cationic compounds such as pyrilium ion, diphenyliodonium ion and the like; etc.

As the sensitizer used in combination with the above-mentioned radical generator, there are mentioned, for example, coloring matter or dye compounds such as acridine type coloring matter, ketocoumarin type coloring matter, merocyanine type coloring matter, xanthene type coloring matter, thioxanthene type coloring matter, styrylquinoline type coloring matter, Methylene Blue, Safranine, Malachite green, cyanine dyes, Rhodamine dyes and the like; triazine derivatives having a dialkylaminophenyl group bonded directly or through a double bond to its s-triazine nucleus; and the like. However, the combination of the radical generator with the sensitizer is not limited to the above-mentioned combinations, and other combinations can be used as far as they satisfy the above-mentioned conditions.

The combination of the radical generator with the sensitizer is preferably a combination of hexaarylbiimidazole with an acridine type coloring matter, a combination of a triazine derivative having a dialkylaminophenyl group bonded to its s-triazine nucleus, a combination of N-phenylglycine with a ketocoumarin type coloring matter or a thioxanthene type coloring matter, a combination of 2,4,6-tris(trichloromethyl)-s-triazine (abbreviated as TCT), 3-phenyl-5-isooxazolone or 2-mercaptobenzimidazole with a merocyanine type coloring matter, a combination of 1,3-di(tert-butyloxycarbonyl)benzophenone (abbreviated as PBIF) or 3,3',4,4'-tetrakis(tert-butyloxycarbonyl) benzophenone (abbreviated as TBBP) with a merocyanine type coloring matter, a styrylquinoline type coloring matter or a ketocoumarin type coloring matter, a combination of an anionic compound such as triphenylbutyl borate ion, trianicylbutyl borate ion or the like with Methylene Blue, Safranine, Malachite green, cyanine dye or Rhodamine dye; a combination of a cationic compound such as pyrilium ion, diphenyliodonium ion or the like with a xanthene type coloring matter or the like.

To the combination of the radical generator with the sensitizer of this invention can be added such a substance as to strengthen the sensitivity at a wavelength region of from 400 to 580 nm, for example, a chain transfer agent, a sensitizing adjuvant or the like. On the contrary, if the radical generator can satisfy alone the above-mentioned conditions, the radical generator can be used alone.

The amounts of the radical generator and the sensitizer used are preferably such that the amount of the radical generator used is 0.5 to 40 parts by weight, more preferably 1 to 20 parts by weight, per 100 parts by weight of the resin and the amount of the sensitizer used is 0.05 to 20 parts by weight, more preferably 0.2 to 10 parts by weight, per 100 parts by weight of the resin.

In order to strengthen the resin of a polymerized resin pattern selectively formed in this invention, the photopolymerizable resin may contain a resin which cures upon heating (a thermosetting resin). Such a thermosetting resin includes an epoxy resin, an acrylic resin, a phenol resin, a melamine resin, a polyester resin, a silicon resin and the like. For example, when an acryl-modified epoxy resin is used, it is possible to obtain a strong resin layer by polymerizing the acryl group with the photopolymerization initiator, removing the unpolymerized portion by development and thereafter curing the epoxy group by heating. In this case, a curing agent for heat-curing the epoxy group is added to the resin. Also, as other components than the resin, such components as fillers, coloring agents and the like can be added, and a solvent can also be added during the coating.

The photopolymerizable resin which polymerizes with a reflected light from the photosensitive substance is coated on the surface of the substrate and dried. The thickness of the dried coating is desirably about 5 to 200 $\mu m$. Thereafter, the coating is irradiated with an irradiation light capable of exciting the photosensitive substance. In this case, a filter is applied to the light source for cutting the light having a wavelength longer than the wavelength to which the photopolymerizable resin responds. When the photosensitive substance is a fluorescent whitening agent, the wavelength cut by the filter is usually selected from the range of from 380 nm to 500 nm. The method of forming a pattern of this invention is considered to be utilized in the formation of a relief for a printing plate; the formation of a stereoscopic pattern in the field of interior trim of construction; the production of a resin artificial tooth and a crown of tooth; and the like.

When the substrate is irradiated with ultraviolet rays, the fluorescent whitening agent in the substrate absorbs the ultraviolet rays and its energy allows the fluorescent whitening agent to radiate a reflected light having a long wavelength (a visible light). The photopolymerizable resin coated on the substrate is not activated by the ultraviolet rays (the irradiation light) but is activated by the light reflected by the fluorescent whitening agent (the radiation light) and is polymerized therewith. In this case, the photopolymerizable resin coated on the portion in which the photosensitive substance present on or contained in the substrate is not exposed to the irradiation light is not polymerized because it is not exposed to the radiation light from the photosensitive substance, and only the photopolymerizable resin coated directly onto the substrate polymerizes.

Thereafter, the unpolymerized resin is removed by development. In addition, if necessary, the curing can also be allowed to proceed by heating. Thus, it becomes possible to selectively form a cured resin layer, for example, to form a resin layer only in such a space as between pads provided at a very narrow pitch on a printed wiring board.

According to this invention, it is not necessary to use, as a substrate, particularly as a glass cloth material, a special grade one having an improved dimension stability, and for keeping the dimension stability of a printed wiring board, it is not necessary to take various measures particularly considered in the process for producing a laminate, and it is possible to provide a substrate responding to the high density LSI packaging of a narrow pitch using inexpensive materials by a conventional production process. Moreover, when there are QFP pads and wiring pattern on a substrate, by applying the method of this invention to the QFP pads portion, and by applying the conventional masking method to the wiring pattern portion, the desired resist can be obtained.

Incidentally, when a substrate in which the spaces between the narrow pitch light-impermeable layers are filled with an insulator is produced according to the process of this invention, a reliable solder layer can be formed on the thus obtained substrate by a super solder method or a screen printing method, whereby a printed wiring board for mounting can be produced.

DESCRIPTION OF THE PREFERRED EMBODIMENTS

Examples are shown below to explain this invention in more detail.

EXAMPLE 1

Figure 2:
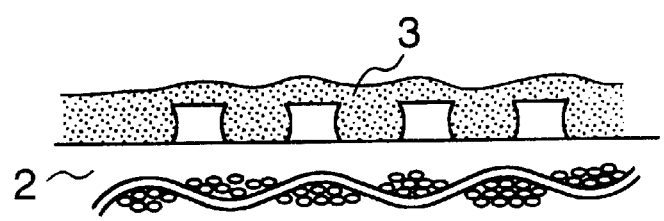
FIG. 2 is a cross-sectional view of the substrate after having been coated with a resist ink.

As shown in FIG. 1, QFP pads 1 were formed by a conventional method on a substrate 2 containing 2,5-bis(5'-tert-butylbenzoxazolyl(2))thiophene [a photosensitive substance (fluorescent whitening agent): Ubitex OB manufactured by Ciba Geigy showing an absorption curve and a radiation curve a shown in FIG. 5]. The pads 1 was 0.25 mm in pitch, 0.1 mm in pad width and 50 µm in pad height. Subsequently, as shown in FIG. 2, a resist ink (photopolymerizable resin) 3 having the following composition was coated on the substrate and the thickness of the coating was 50 to 60 µm:

| Resist ink composition | |
|---|---|
| Methyl methacrylate | 60% by weight |
| Polyethylene glycol acrylate | 20% by weight |
| Urethane methacrylate | 10% by weight |
| 2,4,6-Tris(trichloromethyl)-s-triazine (TCT) (=radical generator) | 5% by weight |
| Merocycanine coloring matter (=sensitizer) | 5% by weight |

Figure 3:
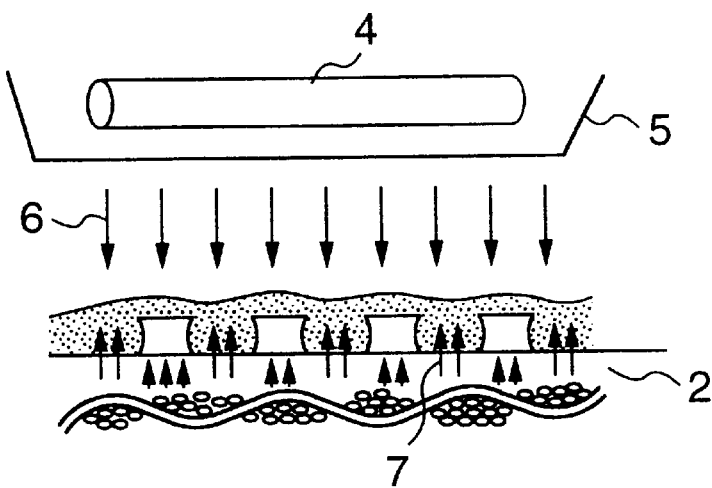
FIG. 3 shows the state in which the resist ink is photopolymerized with a reflected light resulting from the irradiation of the substrate with an irradiation light.
Figure 4:
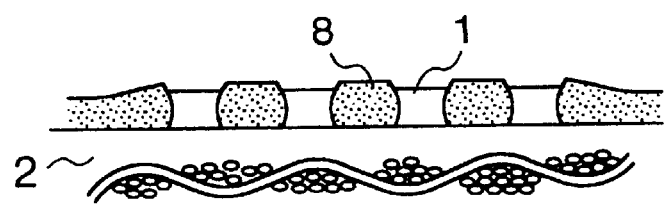
FIG. 4 is a cross-sectional view of the substrate after the unpolymerized portions of the resist ink have been removed.

Incidentally, as the ultraviolet ray source, a super high pressure mercury vapor lamp (Model CHM manufactured by Oak Seisakusho) was used. Subsequently, as shown in FIG. 3, the coated surface of the substrate was irradiated with an irradiation light 6 (ultraviolet ray) having the most sensitive wavelength of 365 nm (the wavelength region: from 200 to 400 nm) and an irradiation energy of 1 mJ to 5 mJ through an optical filter [a filter for cutting the wavelength region of at least 400 nm (ICF-400 manufactured by Oak Seisakusho)]. The fluorescent whitening agent in the substrate was exposed to the irradiation light and radiated a reflected light (radiation light) 7, and the resist ink between the pads was exposed to the radiation light. Since the pads themselves were light-impermeable, nothing on the pads were exposed to the radiation light. Subsequently, the substrate was developed by immersing the same in a 1% by weight aqueous sodium carbonate solution. In this case, the unpolymerized portions of a photopolymerizable resin on the pads which were light-impermeable were removed and a resin was formed only in between the narrow pitch light-impermeable layers. In FIG. 4, the cross-sectional view of the substrate after heat-drying is shown, and a resist was formed in between the pads without a deviation, a fog or a gap.

Incidentally, using a combination of 2,4,6-tris(trichloromethyl)-s-triazine with merocyanine coloring matter, two photopolymerizable resin layers each having a thickness of 40 µm were prepared, and one of them was irradiated with ultraviolet rays having a wavelength region of from 300 nm to 400 nm and the other was irradiated with a visible light having a wavelength of 488 nm. They were developed with a 1% by weight aqueous sodium carbonate solution as a developer. As a result, Y was 0.5 mJ/cm$^2$ and X was 3 mJ/cm$^2$.

COMPARATIVE EXAMPLE 1

The same procedure as in Example 1 was repeated, except that the fluorescent whitening agent was not used. No cured resin was produced.

COMPARATIVE EXAMPLE 2

The same procedure as in Example 1 was repeated, except that an ink of a photosensitive resin which was cured with an ultraviolet ray (acrylic ink, PSR-4000 manufactured by Taiyo Ink Production Co., Ltd.) was substituted for the resist ink. As a result, the whole surface of the coating on the substrate was cured.

COMPARATIVE EXAMPLE 3

The same procedure as in Example 1 was repeated, except that the resist ink was replaced by the same ink of a photosensitive resin as in Comparative Example 2 and a photomask which shaded the light from only the pad portion was used on the coating film. As a result, a deviation, a fog and the like were found on the cured resin produced between the pads.

EXAMPLE 2

Unprinted portions were formed using an emulsion film having a thickness of 15 μm on a 100-mesh screen, to prepare a screen printing plate having patterns of ○, Δ and □.

Subsequently, using this screen printing plate, a thermosetting epoxy resin containing 2,5-bis(5'-tert-butylbenzoxazolyl(2))thiophene (Ubitex OB manufactured by Ciba Geigy) which was a fluorescent whitening agent was printed in the shapes of ○, Δ and □ (5 μm in thickness) as shown in FIG. 5 on a paper substrate-melamine resin laminate. The printing plate was taken off and thereafter the thermosetting epoxy resin was heated at 60° C. for 10 minutes to be cured.

On the laminate on which the patterns were printed, an ink (photopolymerizable resin) having the following composition was coated in a thickness of about 100 μm by a spray method:

| Ink composition | |
|---|---|
| Methyl methacrylate | 60% by weight |
| Polyethylene glycol acrylate | 20% by weight |
| Urethane methacrylate | 10% by weight |
| Hexaaryl bisimidazole (=radical generator) | 5% by weight |
| Acridine coloring matter (=sensitizer) | 5% by weight |

Irradiation with a light was conducted in the following manner:

As an ultraviolet ray source, a super high pressure mercury vapor lamp (Model CHM manufactured by Oak Seisakusho) was used, and as shown in FIG. 6, the coated surface of the substrate was irradiated with an irradiation light (ultraviolet ray) 6 having the most sensitive wavelength of 365 nm (wavelength region: from 300 nm to 400 nm) and an irradiation energy of 1 mJ to 5 J which had passed through an optical filter [a filter for cutting a long wavelength region of at least 400 nm (ICF-400 manufactured by Oak Seisakusho)]. The fluorescent whitening agent in the substrate enabled the coated surface of the substrate to be irradiated with said irradiation light (ultraviolet ray).

The fluorescent whitening agent coated in the patterns of ○, Δ and □ on the substrate radiated a reflected light (radiation light) upon irradiation with ultraviolet rays, and the ink on the patterns of ○, Δ and □ was exposed to the radiation light. The ink in the other portions than the patterns of ○, Δ and □ was not exposed to the radiation light. Subsequently, the substrate was developed with 1% by weight aqueous sodium carbonate solution by a spray method.

As a result, the photopolymerizable resin which was in other areas than the areas of ○, Δ and □ and which was not exposed to the radiation light was removed, and only in the areas of ○, Δ and □ which were exposed to the radiation light, the resin was formed in the convex shape (FIG. 7).

EXAMPLE 3

Figure 9:
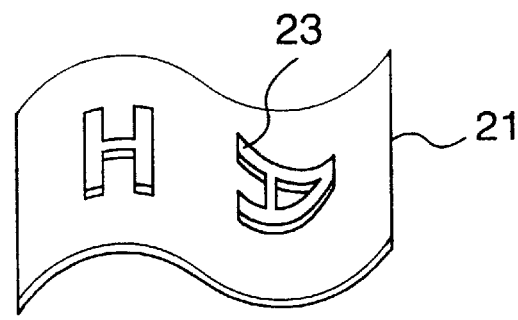
FIG. 9 is a perspective of the substrate of FIG. 8 having on its surface convex letters of the resist ink obtained by carrying out the photopolymerization of the resist ink of the substrate.

Letters H and A were drawn as shown in FIG. 8 by a paint brush on a substrate having a curved surface using an epoxy resin containing the same fluorescent whitening agent as in Example 2. The same ink as in Example 1 was coated thereon by a spray coat method and subjected to irradiation with ultraviolet rays and development in the same manner as in Example 2. Convex patterns H and A were formed on the curved surface of the substrate (FIG. 9).

EXAMPLE 4

Letters H and A were drawn on a polyimide film on which a release layer was previously formed, and when a substrate having a curved surface was molded by an injection molding, the above polyimide film was set on the internal surface of one of the molds during the injection molding, the molds were closed and a resin was injected thereinto to obtain a molded article (FIG. 10).

The molded article was taken out and the polyimide film was peeled off to obtain a molded article in which letters H and A were transferred to the curved surface. Subsequently, in the same manner as in Example 3, convex patterns H and A were formed on the curved surface.

What is claimed is:

1. A method for forming a pattern which comprises:
   (a) providing a light-permeable substrate containing a photosensitive substance which absorbs an irradiation light and radiates a radiated light having a longer wavelength than the wavelength of said irradiation light, said substrate having a light impermeable layer formed in an inverted pattern of a desired pattern;
   (b) forming on said substrate a photopolymerizable resin layer which contains a radical generator and a sensitizer, said photopolymerizable resin layer not being activated by said irradiation light but being activated by said radiated light;
   (c) irradiating said photosensitive substance with said irradiation light, which excites said photosensitive substance, generating said radiated light from said photosensitive substance to irradiate said photopolymerizable resin layer, activating the photopolymerizable resin layer and polymerizing said photopolymerizable resin layer in a portion corresponding to said desired pattern thereby producing a polymerized portion and an unpolymerized portion in said photopolymerizable resin layer; and thereafter,
   (d) removing said unpolymerized portion in said photopolymerizable resin layer.

2. The method according to claim 1, wherein said light-impermeable layer having a pitch less than 0.5 mm is provided and the space in said light-impermeable layer is filled with said polymerized portion formed by selectively polymerizing said photopolymerizable resin layer.

3. The method according to claim 2, wherein said light impermeable layer includes a pad.

4. The method according to claim 2, wherein said light impermeable layer includes a printed circuit.

5. The method according to claim 2, wherein said light impermeable layer formed on the substrate includes pads or circuits.

6. The method according to claim 1, wherein said light impermeable layer formed on said substrate includes pads or circuits.

7. The method according to claim 1, wherein said step (b) of forming the photopolymerizable resin layer comprises coating a photopolymerizable resin onto the substrate.

8. The method according to claim 1, wherein said step (b) of forming the photopolymerizable resin layer comprises laying a sheet of the photopolymerizable resin onto the substrate.

9. A method for forming a pattern which comprises:
(a) providing a light-impermeable substrate having a layer of a photosensitive substance formed in a desired pattern;
(b) forming on said substrate a photopolymerizable resin layer which contains a radical generator and a sensitizer, said photopolymerizable resin layer not being activated by an irradiation light but being activated by a radiated light radiated from the photosensitive substance;
(c) irradiating said photosensitive substance with said irradiation light which excites said photosensitive substance, generating said radiated light from said photosensitive substance to irradiate said photopolymerizable resin layer, activating the photopolymerizable resin layer and polymerizing said photopolymerizable resin layer in a portion corresponding to said desired pattern thereby producing a polymerized portion and an unpolymerized portion in said photopolymerizable resin layer; and thereafter,
(d) removing said unpolymerized portion in said photopolymerizable resin layer.

10. The method according to claim 1 or 9, wherein said photosensitive substance is a fluorescent whitening agent.

11. The method according to claim 10, wherein said irradiation light is an ultraviolet light whose long wavelength region longer than about 400 nm has been removed by an optical filter.

12. The method according to claim 11, wherein said light impermeable layer formed on said substrate includes pads or circuits.

13. The method according to claim 10, wherein said irradiation light is an ultraviolet light whose long wavelength region longer than about 400 nm has been removed by an optical filter.

14. The method according to claim 13, wherein said light impermeable layer formed on said substrate includes pads or circuits.

15. The method according to claim 10, wherein said light impermeable layer formed on said substrate includes pads or circuits.

16. A method for forming a pattern which comprises:
(a) providing a light-permeable substrate having a photosensitive substance layer formed in a desired pattern, wherein said photosensitive substance absorbs an irradiation light and radiates a radiated light having a longer wavelength than the wavelength of said irradiation light;
(b) forming on said substrate a photopolymerizable resin layer which contains a radical generator and a sensitizer and which is not activated by the irradiation light but is activated by said radiated light;
(c) irradiating said photosensitive substance with said irradiation light, which excites said photosensitive substance, generating said radiated light from said photosensitive substance to irradiate said photopolymerizable resin layer, activating said photopolymerizable resin layer and polymerizing said the photopolymerizable resin layer in a portion corresponding to said desired pattern, thereby producing a polymerized portion and an unpolymerized portion in said photopolymerizable resin layer, and thereafter,
(d) removing said unpolymerized portion in said photopolymerizable resin layer.

17. The method according to claim 16, wherein said photosensitive substance is a fluorescent whitening agent.

18. The method according to claim 17, wherein the irradiation light is an ultraviolet light whose long wavelength region longer than about 400 nm has been removed by an optical filter.

19. The method according to claim 16, wherein said irradiation light is an ultraviolet light whose long wavelength region longer than about 400 nm has been removed by an optical filter.

* * * * *